United States Patent

Tatah et al.

[11] Patent Number: 5,814,165
[45] Date of Patent: Sep. 29, 1998

[54] UV LASER ANNEALING AND CLEANING OF DEPOSITED METAL AND DIELECTRIC LINES

[75] Inventors: Abdelkrim Tatah, Arlington; Carl V. Thompson, Acton, both of Mass.

[73] Assignees: Matsushita Electric Industrial Co., Ltd., Osaka, Japan; Massachusetts Institute of Technology, Cambridge, Mass.

[21] Appl. No.: 977,924

[22] Filed: Nov. 24, 1997

Related U.S. Application Data

[63] Continuation of Ser. No. 717,926, Sep. 23, 1996, abandoned.

[51] Int. Cl.[6] ........................................................ C21D 1/04
[52] U.S. Cl. .......................... 148/565; 204/157.41; 134/1
[58] Field of Search ............................ 148/565; 204/155, 204/157.41; 134/1; 427/53.1; 29/846

[56] References Cited

U.S. PATENT DOCUMENTS

| 4,432,855 | 2/1984 | Romankiw et al. | 204/207 |
| 4,832,798 | 5/1989 | Cvijanovich et al. | 204/15 |

*Primary Examiner*—Sikyin Ip
*Attorney, Agent, or Firm*—Ratner & Prestia

[57] ABSTRACT

A method for simultaneously annealing a metal or dielectric line and cleaning metal debris deposited in the vicinity of the line by generating an ultraviolet laser beam, focusing the ultraviolet laser beam onto the line, and exposing the line to the ultraviolet laser beam for a period of time sufficient to melt and reflow the line and evaporate small particles of debris. The method may also be used to repair metal or dielectric lines. Laser ablation forward metal deposition may be used in combination with the UV laser annealing method in order to perform the repair.

9 Claims, 3 Drawing Sheets

UV LASER ANNEALING AND CLEANING OF DEPOSITED METAL AND DIELECTRIC LINES

This application is a continuation of application Ser. No. 08/717,926 filed Sept. 23, 1996, now abandoned.

FIELD OF THE INVENTION

This invention relates to deposition and repair of metal and dielectric lines and, more particularly, to annealing and cleaning such lines using ultraviolet wavelength laser beams.

BACKGROUND OF THE INVENTION

Metal lines are commonly used for connecting circuits in personal computer boards and multichip modules and forming electrodes on flat panel displays. Dielectric lines are used to separate conductors in applications such as these. Existing metal line patterning and deposition techniques include laser chemical vapor deposition, laser deposition from metal precursors, laser writing, electron beam writing, ion-beam writing, and x-ray writing. All of these techniques may also be used to repair metal lines.

An additional metal line deposition and repair technique is laser ablation forward metal deposition. Laser ablation of metal films in general is a widely known technique wherein a laser beam is focused onto a metal film. The heat and shock wave generated by the laser beam remove, or discharge, particles of the film. Thin films of metals such as copper, gold, and silver may be easily removed, or ablated, using green light lasers, such as Q-switched doubled Nd:YAG, Nd:YLF, or copper vapor lasers. The ablated particles settle on a target substrate to form the deposited metal film.

Metal lines formed by laser ablation forward metal deposition (and by the other methods) are often inhomogeneous. "Inhomogeneous" as used herein means "containing voids." Voids in metal lines may increase resistance and decrease reliability of the metal lines. In addition, metal lines formed by laser ablation forward metal deposition (and other methods) may have fine particles of a metal in their proximity as a result of the deposition or patterning process. This fine debris can be a hindrance, for example, in the repair of electrodes of flat panel displays. In that situation, the debris may become dislodged, contaminate adjacent image-forming cells, or appear as a defect in the display image.

Presently, metal lines are made homogeneous (i.e., without voids) by annealing the circuit board or other substrate upon which the metal line is deposited in an oven in a hydrogen/nitrogen environment for a period of hours. In addition to the disadvantage of requiring a hydrogen/nitrogen environment, this technique is also slow and cannot be localized to specific repairs.

Known methods for cleaning fine particles of metal debris from around the metal lines involve using wet processes. These processes are invasive techniques, however, that are undesirable in applications such as flat panel display electrode repair.

An improved technique for annealing metal lines to remove voids and for cleaning metal debris from the line in an atmospheric environment and at a specific location of a circuit is desired.

SUMMARY OF THE INVENTION

The present invention provides a method for simultaneously annealing a metal or dielectric line and cleaning debris deposited in the vicinity of the line by generating an ultraviolet laser beam, focusing the ultraviolet laser beam onto a portion of the line, and exposing the portion of the line to ultraviolet laser beam for a period of time sufficient to melt and reflow the line and evaporate small particles of debris. The focus of the UV laser beam is then moved to another portion of the line and the process is repeated until the entire line has been annealed. The method may also be used to repair metal and dielectric lines. Laser ablation may be used in combination with the UV laser annealing method in order to perform the deposition or repair.

BRIEF DESCRIPTION OF THE DRAWINGS

FIG. 4 is an electron micrograph of a deposited metal line.

FIG. 5 is an electron micrograph of a deposited metal line.

FIG. 6 is an electron micrograph of a deposited metal line.

FIG. 7 is an optical micrograph of a deposited metal line.

FIG. 8 is an optical micrograph of a deposited metal line.

DETAILED DESCRIPTION OF THE INVENTION

Figure 1:
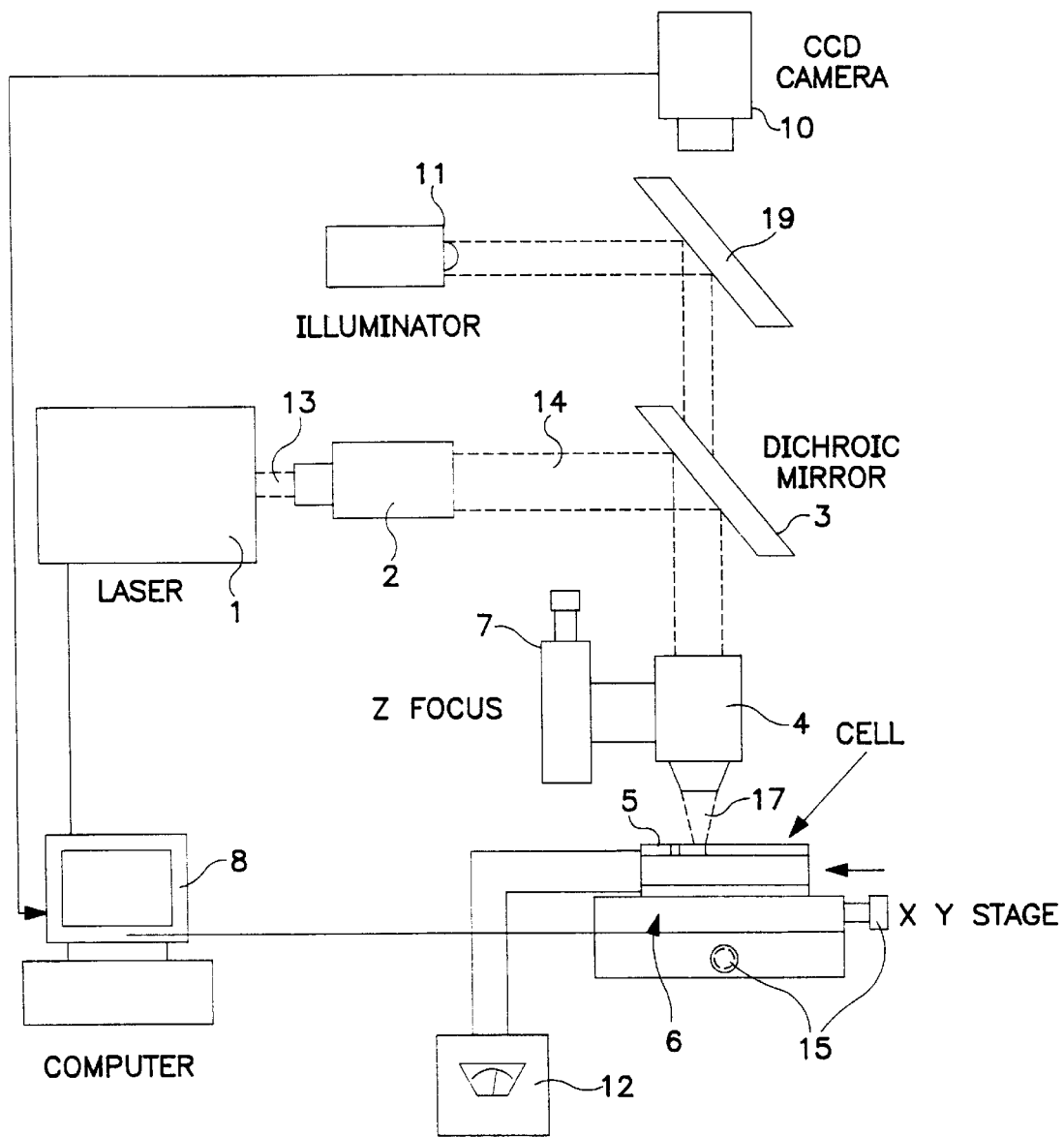
FIG. 1 is a side plan view of laser metal deposition apparatus.

According to the present invention, deposited metal and dielectric lines are annealed using a UV laser beam that melts and reflows the lines to make them homogeneous and to clean away particle debris from the vicinity of the lines. FIG. 1 illustrates a laser metal deposition apparatus. Laser 1 is a harmonically doubled solid state Q-switched Nd:YLF or Nd:YAG laser. A suitable laser is, for example, a Spectra-Physics 7300 Series Diode Pumped Nd:YLF laser. Laser beam 13 from laser 1 is expanded by telescope 2 into expanded beam 14. Beam 14 shines on dichroic mirror 3 which directs beam 14 into objective lens 4. Objective lens 4 focuses the beam to a diffraction limit spot on sample 5.

In FIG. 1, illuminator 11 provides light that is deflected by mirror 9 onto dichroic mirror 3. Illuminator 11 is used as a white light source to illuminate sample 5 so that the process and location of the focused spot can be monitored. A suitable illuminator is available from Edmund Scientific Company in Barrington, N.J.

A CCD camera 10 is used to image and monitor the process location. The image generated by CCD camera 10 is fed to computer 8 which computes subsequent process locations based on a programmed path. Any state of the art video camera is suitable for this purpose.

Sample 5 is supported on stage 6. Stage 6 is equipped with X-Y motion controls 15 that are controlled by computer 8. Suitable motion controls and computer are available from New England Affiliated Technologies in Lawrence, Mass., and comprise, for example, an XY-8080 precision stage, a PCX2 controller, and a 202M microstepping drive, with the controller interfaced to a 486 IBM PC or compatible.

Computer 8 also controls the power of laser 1. By adjusting the position of stage 6 and the power of laser 1, computer 8 enables the deposition of specific patterns on sample 5.

Figure 2:
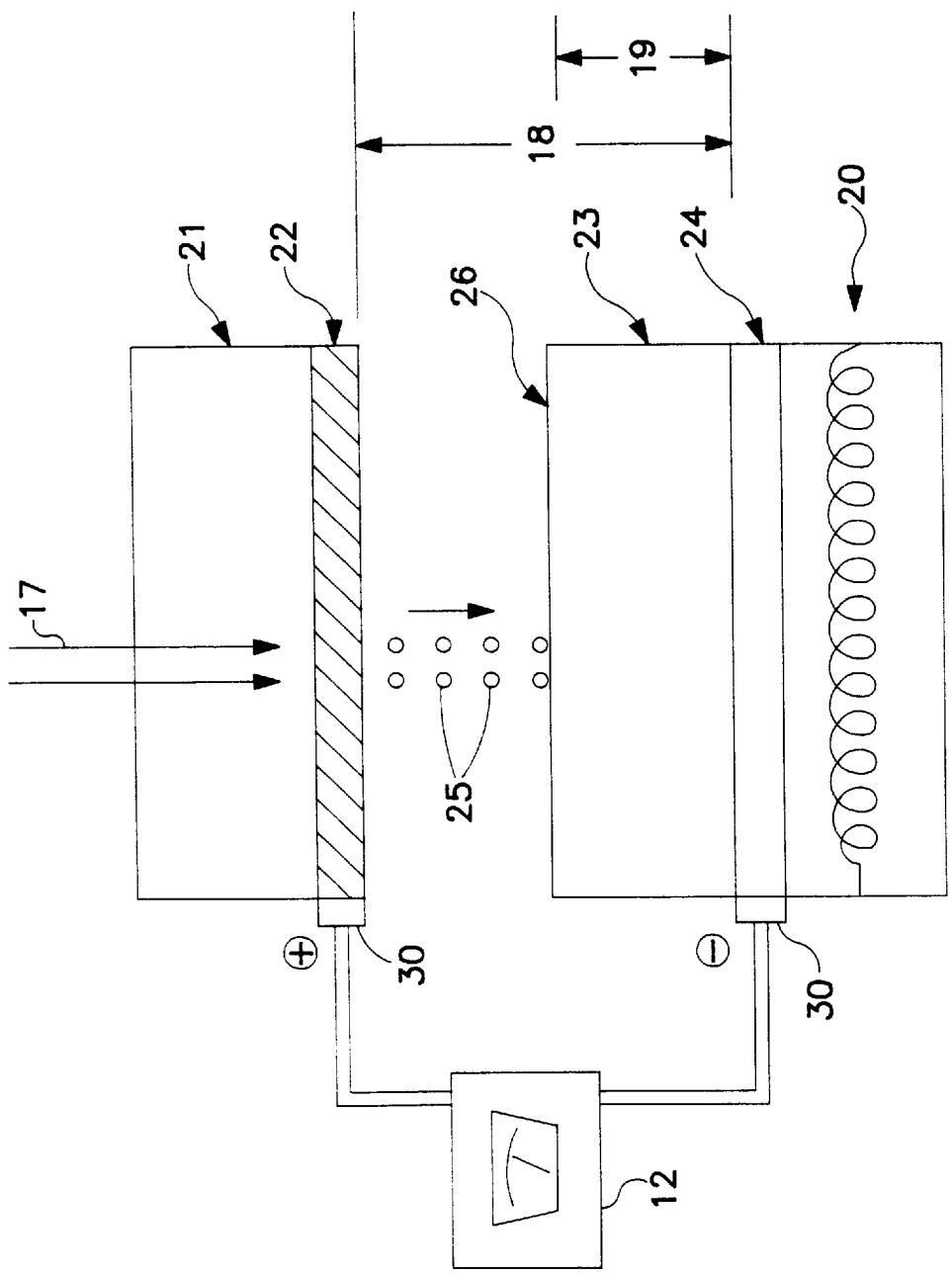
FIG. 2 is a side plan view of an exemplary unit cell for metal deposition and bonding according to the present invention.

Deposition of metal lines onto a substrate is illustrated in FIG. 2. A first substrate 21, which is glass in the exemplary embodiment, is disposed in the path of focused laser beam 17. Glass substrate 21 has metal coating 22 disposed on the side of glass substrate 21 furthest from objective lens 4. Coating 22 may be deposited by standard sputtering deposition or metal plating. Beam 17 passes through glass substrate 21 and impinges on metal coating 22 from the back side; that is, at the surface interface of metal coating 22 and glass substrate 21. The contact of laser 17 with metal coating 22 results in ablation of metal coating 22. During ablation, metal ions 25 accelerate away from metal coating 22.

Second substrate 23, which is also glass in the exemplary embodiment, is disposed adjacent to the side of first glass substrate 21 having metal coating 22 thereon. As metal ions 25 accelerate from glass substrate 21 by ablation caused by focused laser beam 17, metal ions 25 contact second glass substrate 23.

In the illustrated embodiment, an electric field is applied across first glass substrate 21 and second glass substrate 23 using power supply 12. Power supply 12 is used to create the electric field in this embodiment. Power supply 12 has a positive electrode 30 attached to the metal coating 22 and a negative electrode 31 connected to second glass substrate 23. In the exemplary embodiment shown, the voltages applied across the electrodes are at least 300 volts.

In the exemplary embodiment shown, the electric field drives positively charged metal ions 25 toward second glass substrate 23. The transfer of metal ions 25 from metal film 22 to surface 26 is due to the electrostatic force and laser ablation-generated acoustic shock waves.

The electric field applied across first glass substrate 21 and second glass substrate 23 also assists the bonding of metal ions 25 to second glass substrate 23. Because of the contact of the negative electrode with second glass substrate 23, the positive ions such as sodium ions in glass substrate 23 migrate away from surface 26 toward the negative electrode. This leaves behind negative ions such as oxygen in the glass substrate 23. These negative ions electrostatically bond with the positive metal ions that contact surface 26. A permanent chemical seal due to a thin metal oxide layer is formed after the electric field is removed. Conducting metal lines can thus be formed on surface 26 of second substrate 23 from metal ions 25.

A hot plate 20 may be used to augment the migration of positive ions within second glass substrate 23 to the negative electrode and thus enhance the bonding of metal ions 25 to surface 26 of second glass substrate 23. The heat increases the diffusion and allows for greater mobility of the ions in the glass.

By adjusting stage controls 15 and the power of laser 1, computer 8 enables movement of stage 6, and hence sample 5, under beam 17. This allows metal line patterns to be written on sample 5. Alternatively, the beam can be moved with a scanner and a scanning lens with the sample held stationary under the beam.

The spacing 18 between the first glass substrate 21 and the second glass substrate 23 may be adjusted to vary the feature size (width) of the resulting metal lines on second substrate 23. As the substrates 21 and 23 are moved further apart to increase spacing 18, the feature size of the lines increases.

The thickness of metal coating 22 may be varied in order to change the thickness of the metal lines on second substrate 23. Having a thicker metal coating 22 on substrate 21 allows more metal ions 25 to be ablated. This produces a thicker metal line.

Deposited metal lines, particularly those formed by laser ablation forward metal deposition, are often inhomogeneous and have metal debris in the vicinity of the lines, even when the electric field is used to minimize debris as described above. These defects may produce undesirable high-resistivity lines.

Figure 3:
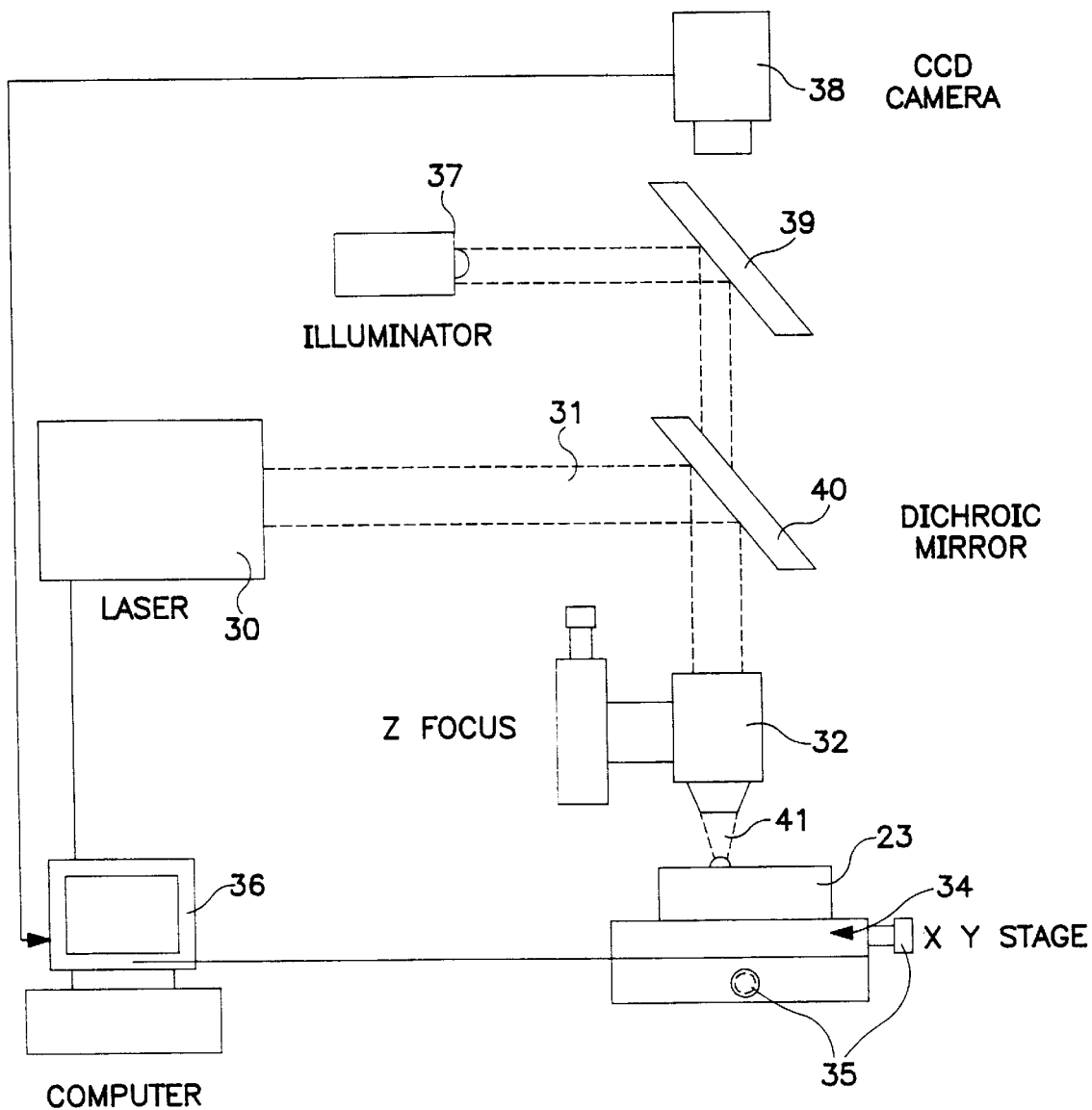
FIG. 3 is a side plan view of a laser annealing apparatus according to an exemplary embodiment of the present invention.

After a metal line has been deposited, the present invention provides a method for annealing the metal line to render it homogeneous, thereby improving conductivity, and for cleaning away any fine metal debris around the deposited line. FIG. 3 illustrates a system used for annealing the metal lines. In FIG. 3, a laser 30 generates laser beam 31 which is reflected by dichroic mirror 40 toward objective lens 32. Lens 32 focuses beam 31 into a focused beam 41 onto a portion of metal line 33 which has been deposited on second substrate 23. The focus of beam 31 is on the portion of metal line 33 for a period of time sufficient to melt and reflow the line. The positioning of second substrate 23 is then moved, if necessary, such that beam 31 focuses on another portion of metal line 33. This process is repeated until the entire line has been annealed.

XY stage 34 is used to control the positioning of second substrate 23 under lens 32. Control knobs 35 may be used for this purpose in connection with computer 36. Computer 36 receives signals from CCD camera 38 in order to determine the positioning of XY stage 34. Illuminator 37 is used to provide the illumination necessary for operation of CCD camera 38. Light from illuminator 37 is reflected onto the metal line 33 by lens 39.

The laser 30 used to anneal metal line 33 in the illustrated embodiment is a Surelite II continuum solid state laser, available from Continuum, Inc. in Santa Clara, Calif. The remaining apparata, CCD camera 38, illuminator 37, XY stage 34 and controls, and computer 36, may all be the same as disclosed above in conjunction with the deposition of the metal lines.

EXAMPLE 1

A Surelite II continuum solid state laser working at 250 mW power, 10 Hz repetition rate, and 266 nm UV wavelength was focused down to 2 mm diameter. The focused spot was exposed for up to 5 seconds on copper metal lines that had been deposited by laser ablation forward metal deposition as described herein without the application of an electric field without the application of an electric field.

FIG. 4 is an electron micrograph of a pair of copper metal lines deposited by laser ablation forward metal deposition immediately after deposition, before exposure to UV laser annealing. The fine metallic debris and metal line inhomogeneity can be observed. FIG. 5 is an electron micrograph of the same pair of lines after UV laser annealing. After exposure to the UV laser beam, the metal lines look homogeneous, shiny, and have improved conductivity. The metal debris seen around the lines in FIG. 4 is cleaned away by the annealing process as shown in FIG. 5.

The resistivity of a metal line was measured before and after UV annealing according to the present invention. The line after annealing is shown in the electron micrograph of FIG. 6. Resistivity before annealing was 8 micro-ohms per centimeter. After annealing in accordance with the present invention, the resistivity improved to 3 micro-ohms per centimeter.

FIG. 7 is an optical micrograph of a deposited metal fine before laser annealing according to the present invention. FIG. 8 shows the same line in an optical micrograph after laser annealing. The amount of debris particles seen around the line in FIG. 7 is greatly reduced in FIG. 8. The particles migrate toward the metal line or are evaporated upon annealing. FIGS. 7 and 8 illustrate the dramatic improvement in line formation that may be achieved with the annealing method of the present invention.

Exposing metal lines to UV laser annealing after deposition causes the lines to melt, reflow, and anneal. The melting and reflowing helps remove the voids in the deposited line. In addition, the metal debris around the line is removed because the heavy metal particles close to the lines are drawn in by surface tension during annealing. Relatively light and small, dense metallic particles in the vicinity of the line are evaporated during the annealing process.

UV laser annealing as described above provides the distinct advantage of enabling simultaneous metal annealing and metal debris evaporation. The energy of the UV laser is desirably such that the metal line melts and reflows, but such that only the small (i.e. sub-micron) particles evaporate. UV laser beams are used because the UV wavelength is strongly absorbed by the metal line and moderately absorbed by the glass. As a result, the metal and the glass substrate both heat up so that no stress exists between the substrate and the metal upon cooling. Accordingly, the metal line will have enhanced reliability and adhesion to the substrate. The UV wavelength may also serve to minimize oxidation by breaking the metal-oxygen bond formed on the surface of the metal with oxygen from the air.

According to the present invention, UV laser annealing produces annealed metallic lines with improved conductivity while simultaneously cleaning fine metal debris from around the metallic lines. Although the invention has been described with reference to a particular embodiment, it is not intended to be limited thereto. Rather, the scope of the invention is intended to be interpreted according to the scope of the appended claims. Specifically, although show separately in conjunction with FIG. 3, the laser used for annealing may be incorporated into the overall system for depositing the metal lines, as in the exemplary embodiment shown in FIG. 1, such that separate equipment is unnecessary. (The system of FIG. 3 is the same as that of FIG. 1 except different wavelength lasers are used and no telescopic lens is used with UV laser 30 of FIG. 3. When both deposition and annealing are performed by the same laser, the laser may be a tripled wavelength laser such as that typically available from Big Sky, Inc. in Bozeman, Mont.) Finally, although described in connection with laser ablation forward metal deposition, the UV laser annealing process of the present invention is equally suited to treat both metal and dielectric lines formed by other methods.

What is claimed:

1. A method for simultaneously reflowing a deposited metal or dielectric line on a glass substrate and cleaning deposited metal particles deposited in the vicinity of the line comprising the steps of:

(a) providing a glass substrate containing deposited metal particles, a deposited metal line and/or dielectric line;
   (b) generating an ultraviolet laser beam;
   (c) focusing said ultraviolet laser beam onto said line in an atmospheric environment; and
   (d) causing relatively large deposited metal particles to migrate to the line and evaporating small particles of deposited metal debris by exposing a portion of said line to said ultraviolet laser beam for about 5 seconds to heat said substrate and reflow said line;
   wherein the resistivity of said line improves by at least about 5 micro-ohms per centimeter.

2. A method of repairing a metal or dielectric line on a glass substrate that comprises the steps of:

(a) providing a glass substrate containing deposited metal particles, a metal line and/or dielectric line;
   (b) generating an ultraviolet laser beam;
   (c) focusing said ultraviolet laser beam onto said line in an atmospheric environment; and
   (d) causing relatively large deposited metal particles to migrate to the line and evaporating small particles of deposited metal by exposing a portion of said line to said ultraviolet laser beam for about 5 seconds to heat said substrate and reflow said line;
   wherein the resistivity of said line improves by at least about 5 micro-ohms per centimeter.

3. A method of repairing a metal line on a glass substrate comprising the steps of:

(a) providing a glass substrate containing deposited metal particles, and a metal line;
   (b) depositing additional metal onto said metal line;
   (c) generating an ultraviolet laser beam;
   (d) focusing said ultraviolet laser beam onto said metal line in an atmospheric environment; and
   (e) causing relatively large deposited metal particles to migrate to the line and evaporating small particles of deposited metal by exposing a portion of said line to said ultraviolet laser beam for about 5 seconds to heat said substrate and reflow said line.
   wherein the resistivity of said line improves by at least about 5 micro-ohms per centimeter.

4. A method as claimed in claim 1 wherein said line is copper.

5. A method as claimed in claim 1 further comprising the steps of moving said ultraviolet laser beam relative to said line to expose another portion of said line and repeating said moving as necessary to expose said line in its entirety.

6. A method as claimed in claim 2 wherein said line is copper.

7. A method as claimed in claim 2 further comprising the steps of moving said ultraviolet laser beam relative to said line to expose another portion of said line and repeating said moving as necessary to expose said line in its entirety.

8. A method as claimed in claim 3 wherein said line is copper.

9. A method as claimed in claim 3 further comprising the steps of moving said ultraviolet laser beam relative to said line to expose another portion of said line and repeating said moving as necessary to expose said line in its entirety.

* * * * *